(12) United States Patent
Chen

(10) Patent No.: US 11,147,170 B2
(45) Date of Patent: Oct. 12, 2021

(54) DISPLAY PANELS AND DISPLAY DEVICES

(71) Applicant: Kunshan Go-Visionox Opto-Electronics Co., Ltd., Kunshan (CN)

(72) Inventor: Lingyan Chen, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 152 days.

(21) Appl. No.: 16/740,493

(22) Filed: Jan. 13, 2020

(65) Prior Publication Data

US 2020/0154581 A1 May 14, 2020

Related U.S. Application Data

(63) Continuation of application No. PCT/CN2019/071829, filed on Jan. 15, 2019.

(30) Foreign Application Priority Data

Jul. 18, 2018 (CN) .......................... 201810792967.6

(51) Int. Cl.
H05K 1/00 (2006.01)
H05K 5/00 (2006.01)
(Continued)

(52) U.S. Cl.
CPC .......... *H05K 5/0017* (2013.01); *H01L 25/18* (2013.01); *H01L 27/3276* (2013.01);
(Continued)

(58) Field of Classification Search
CPC ... H05K 5/0017; H01L 25/18; H01L 27/3276; H01L 51/0097
(Continued)

(56) References Cited

U.S. PATENT DOCUMENTS 6,486,544 B1 * 11/2002 Hashimoto ......... H01L 23/5385
257/686
7,450,398 B2 * 11/2008 Oh ........................ H05K 1/148
361/749
(Continued)

FOREIGN PATENT DOCUMENTS

CN 106652802 A 5/2017
CN 106910823 A 6/2017
(Continued)

OTHER PUBLICATIONS

TW First Office Action dated Jan. 15, 2020 in the corresponding TW application (application No. 108105313).
(Continued)

*Primary Examiner* — Andargie M Aychillhum
(74) *Attorney, Agent, or Firm* — Kilpatrick Townsend & Stockton

(57) ABSTRACT

A display panel and a display device are provided. The display panel includes a flexible screen body having a first region and a second region. The second region has a bending transitional region coplanar with the first region, a bending region, and an extending region connected in sequence. The first region is connected to the bending region through the bending transitional region and is at least a part of an active region. The bending region and the extending region are at least a part of a non-active region and not coplanar with the first region. The bending transitional region is another part of the active region or another part of the non-active region. The display panel further includes a buffer layer disposed on surfaces of the bending transitional region and the bending region at a stress concentration side thereof. At least two sections of the buffer layer have different hardnesses.

19 Claims, 2 Drawing Sheets

(51) Int. Cl.
*H01L 25/18* (2006.01)
*H01L 27/32* (2006.01)
*H01L 51/00* (2006.01)
*H01L 51/52* (2006.01)
*H04M 1/02* (2006.01)
*H05K 1/02* (2006.01)
*H05K 1/14* (2006.01)
*H05K 1/18* (2006.01)

(52) U.S. Cl.
CPC ...... *H01L 51/0097* (2013.01); *H01L 51/5246* (2013.01); *H04M 1/0268* (2013.01); *H05K 1/028* (2013.01); *H05K 1/147* (2013.01); *H05K 1/189* (2013.01); *H01L 2251/5338* (2013.01); *H01L 2251/556* (2013.01); *H05K 2201/10128* (2013.01)

(58) Field of Classification Search
USPC .......................................................... 361/749
See application file for complete search history.

(56) References Cited

U.S. PATENT DOCUMENTS

| | | | |
|---|---|---|---|
| 9,660,216 | B2 | 5/2017 | Lee et al. |
| 10,390,444 | B2 | 8/2019 | Choi et al. |
| 2005/0056457 | A1* | 3/2005 | Gall ............... H05K 1/0281 174/254 |
| 2016/0064464 | A1* | 3/2016 | Namkung ......... H01L 27/1218 257/40 |
| 2017/0263887 | A1 | 9/2017 | Han et al. |
| 2017/0373121 | A1 | 12/2017 | Leng et al. |
| 2018/0081399 | A1 | 3/2018 | Kwon et al. |
| 2019/0207130 | A1 | 7/2019 | He et al. |

FOREIGN PATENT DOCUMENTS

| | | |
|---|---|---|
| CN | 107230429 A | 10/2017 |
| CN | 107871451 A | 4/2018 |
| CN | 108198842 A | 6/2018 |
| CN | 108766246 A | 11/2018 |
| KR | 20180049857 A | 5/2018 |
| TW | 201736913 A | 10/2017 |

OTHER PUBLICATIONS

International Search Report dated Apr. 17, 2019 in the corresponding international application (application No. PCT/CN2019/071829).

* cited by examiner

DISPLAY PANELS AND DISPLAY DEVICES

CROSS-REFERENCES TO RELATED APPLICATIONS

This application claims all benefits accruing under 35 U.S.C. § 119 from China Patent Application No. 201810792967.6, filed on Jul. 18, 2018 in the State Intellectual Property Office of China, the content of which is hereby incorporated by reference. This application is a continuation under 35 U.S.C. § 120 of international patent application PCT/CN2019/071829 filed on Jan. 15, 2019, the content of which is also hereby incorporated by reference.

TECHNICAL FIELD

The present disclosure relates to the field of display technology.

BACKGROUND

With the development of information technology, display devices, such as mobile phones, have become an indispensable part of people's lives, while full-screen display devices are becoming pursuit of more and more users. At present, most of the full-screen display devices, as claimed by some manufacturers, are in fact display devices having a very high screen-to-body ratio. A full-screen display is commonly achieved by bending a non-active region of a flexible screen body. The non-active region of the flexible screen body is bent to arrive at a back side opposite to a display side of the flexible screen body to reduce a frame width of the flexible screen body, thereby increasing the screen-to-body ratio.

SUMMARY

A display panel and a display device are provided in the present disclosure.

The display panel includes a flexible screen body and a buffer layer. The flexible screen body has a first region and a second region connected with the first region. The second region has a bending transitional region, a bending region, and an extending region connected in sequence. The first region is connected to the bending region through the bending transitional region, and the bending transitional region is coplanar with the first region. Neither the bending region nor the extending region is coplanar with the first region. The first region is a part of an active region of the flexible screen body; the bending region and the extending region are a non-active region of the flexible screen body; and the bending transitional region is another part of the active region or the non-active region of the flexible screen body. Or, the first region is an active region of the flexible screen body; the bending region and the extending region are a part of a non-active region of the flexible screen body; and the bending transitional region is another part of the non-active region of the flexible screen body. The buffer layer is disposed on surfaces of the bending transitional region and the bending region at a stress concentration side of the bending transitional region and the bending region. At least two sections of the buffer layer have different hardnesses.

In an embodiment, the buffer layer includes a first sub-buffer layer and a second sub-buffer layer. The first sub-buffer layer covers the bending transitional region and a part of the bending region. The second sub-buffer layer covers another part of the bending region. A hardness of the first sub-buffer layer is larger than a hardness of the second sub-buffer layer.

In an embodiment, at least one of the first sub-buffer layer and the second sub-buffer layer is an organic adhesive layer.

In an embodiment, at least one of the first sub-buffer layer and the second sub-buffer layer is an acrylic adhesive layer, a silicone adhesive layer, a polyurethane adhesive layer, or an optically clear adhesive layer.

In an embodiment, thicknesses of both the first sub-buffer layer and the second sub-buffer layer are gradually reduced along the direction from the first region to the second region.

In an embodiment, a thickness of the first sub-buffer layer is larger than a thickness of the second sub-buffer layer.

In an embodiment, the first sub-buffer layer and the second sub-buffer layer are made of a same material.

In an embodiment, the buffer layer includes bending-resistant flexible particles, and a density of the bending-resistant flexible particles in the first sub-buffer layer is larger than a density of the bending-resistant flexible particles in the second sub-buffer layer.

In an embodiment, the bending-resistant flexible particles are selected from the group consisting of nylon particles, polymethyl methacrylate particles, or a combination thereof.

In an embodiment, the bending transitional region has a width larger than or equal to 0.1 mm and smaller than or equal to 0.5 mm.

In an embodiment, the display panel further includes a supporting layer configured to support the flexible screen body. The first region is located at one side of the supporting layer, the extending region is located at another side of the supporting layer away from the first region, and an end of the first sub-buffer layer away from the second sub-buffer layer is adjacent to and in contact with the supporting layer.

In an embodiment, the supporting layer includes a first supporting film located on a surface of the first region adjacent to the extending region; a second supporting film located on a surface of the extending region adjacent to the first region; and a spacing block located between the first supporting film and the second supporting film.

In an embodiment, an end of the first sub-buffer layer away from the second sub-buffer layer is adjacent to and in contact with the first supporting film. An end surface of the second supporting film adjacent to the bending region is coplanar with an interface where the bending region and the extending region are joined.

In an embodiment, a material of the first supporting film and a material of the second supporting film comprise polyethylene terephthalate, and a material of the spacing block comprises silica gel.

In an embodiment, thicknesses of the first supporting film and the second supporting film are larger than or equal to 0 mm and smaller than or equal to 0.2 mm.

In an embodiment, a metal wiring is disposed in the bending region, and an aperture is defined in the metal wiring.

In an embodiment, the bending region has an arched shape.

In an embodiment, a bending angle of the bending region is 180 degrees.

In an embodiment, the display panel further includes a drive unit and a flexible printed circuit disposed on the extending region.

The display device includes the display panel disclosed in the present disclosure.

The details of one or more embodiments of the present disclosure will be described with reference to the following drawings and description. Other characteristic, purposes and advantages of the present disclosure will be more apparent from the specification, drawings and claims.

BRIEF DESCRIPTION OF THE DRAWINGS

Implementations are described by way of example only with reference to the attached figures.

DETAILED DESCRIPTION OF THE INVENTION

For a clear understanding of the technical features, objects and effects of the present disclosure, specific embodiments of the present disclosure will now be described in detail with reference to the accompanying drawings. It is to be understood that the following description is merely exemplary embodiments of the present disclosure, and is not intended to limit the scope of the present disclosure.

In an existing full-screen display device, a non-active area of a flexible screen is bent to achieve a full-screen display. However, when the non-active area is bent, a stress concentration tends to occur at an initial bending position of the flexible screen, in severe cases, a crease may be formed and thus the screen or a conducting wire located at this position may be damaged or even disabled. Therefore, there is a need to provide a novel display panel.

Figure 1:
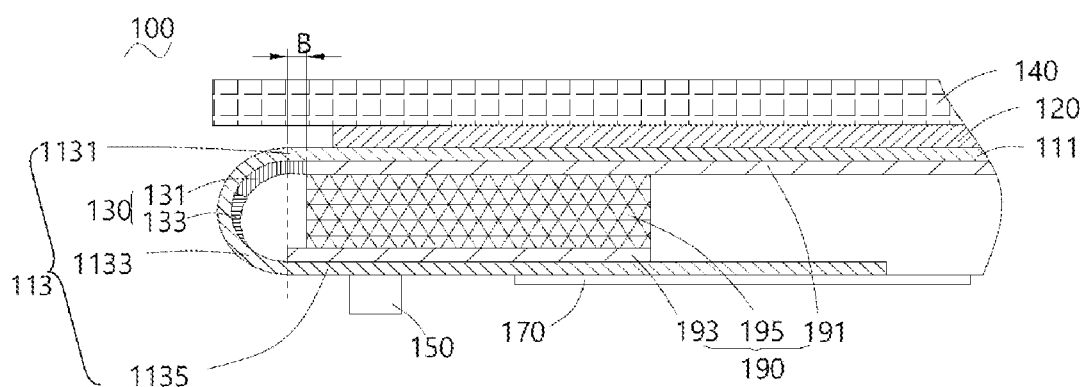
FIG. 1 is a schematic sectional view of a display panel provided by an embodiment of the present disclosure.

Referring to FIG. 1, a display panel 100 is provided in an embodiment of the present disclosure. The display panel 100 includes a flexible screen body and a buffer layer 130.

The flexible screen body has a first region 111 and a second region 113 connected to the first region 111. The second region 113 has a bending transitional region 1131, a bending region 1133, and an extending region 1135 connected in sequence. The first region 111 is connected to the bending region 1133 through the bending transitional region 1131. The bending transitional region 1131 is coplanar with the first region 111. The extending region 1135 is located at an end of the bending region 1133 away from the first region 111. The bending transitional region 1131 is connected to the extending region 1135 through the bending region 1133. Neither the bending region 1133 nor the extending region 1135 is coplanar with the first region 111. The first region 111, the bending transitional region 1131, the bending region 1133, and the extending region 1135 are connected in sequence.

The flexible screen body including the flexible substrate can be divided into an active region and a non-active region adjacent to the active region.

The flexible screen body can include a display layer integrated in the active region on the flexible substrate. The display layer can include a plurality of display components configured for displaying images. The display layer can include a plurality of display components, such as a thin film transistor, a gate line, a data line, a capacitor, an anode, a cathode, an organic light-emitting layer, and/or a color filter film. A polarizer 120 can be further disposed on the display layer to increase a light transmittance of the display layer and reduce reflected lights from an external environment. A flexible cover 140 for protecting the flexible screen body can be further disposed on the polarizer 120.

The flexible screen body can further include an integrated circuit for implementing functions such as signal transmission and signal driving. The integrated circuit can be disposed on the flexible substrate and in the second region 113.

It should be noted that the first region 111 is an active region of the flexible screen body. The bending region 1133 and the extending region 1135 of the second region 113 are a non-active regions of the flexible screen body. The bending transitional region 1131 of the second region 113 can be an active region or a non-active region of the flexible screen body.

When to bend the flexible screen body, only the bending region 1133 of the flexible screen body is to be bent, while structures, such as the polarizer 120, a touch-sensitive layer (if any), and a flexible cover 140, disposed on the display layer are not to be bent.

The flexible screen body can include a metal wiring (not shown) disposed in the bending region 1133. An aperture with a circular shape or other shapes can be defined in the metal wiring to relieve a stress generated during bending the bending region 1133 of the flexible screen body. In an embodiment, the metal wiring in the non-active region of the flexible screen body along it's extending direction has the same cross-sectional shape. The metal wiring in the bending region 1133 of the flexible screen body can be extended along a straight line or a curve line.

The bending region 1133 can have an arched shape. In an embodiment, a bending angle of the bending region 1133 is 180 degrees to allow the extending region 1135 parallel to the first region 111, thus making the extending region 1135 of the flexible screen body to be supported and fixed well, reducing the space occupation of the flexible screen body, and facilitating the implement process.

The buffer layer 130 is disposed on surfaces of the bending transitional region 1131 and the bending region 1133 of the flexible screen body at a stress concentration side. Different sections of the buffer layer 130 can have different hardnesses.

A joining position of the bending region 1133 joined to the bending transitional region 1131 is an initial bending position of the flexible screen body. Different sections of the buffer layer 130 can have different hardnesses. For example, a section of the buffer layer 130 adjacent to the initial bending position can have a higher hardness to support the region of the flexible screen body adjacent to the initial bending position, thereby preventing the stress concentration induced by over-bending the region adjacent to the initial bending position of the flexible screen body, to protect the region of the flexible screen body adjacent to the initial bending position. Correspondingly, a section of the buffer layer 130 located away from the initial bending position of the flexible screen body can have a lower hardness to relieve the stress generated at the corresponding region of the flexible screen body.

In an embodiment, the buffer layer 130 includes a first sub-buffer layer 131 and a second sub-buffer layer 133. The first sub-buffer layer 131 covers the entire of the bending transitional region 1131 and a part of the bending region 1133. The second sub-buffer layer 133 covers another part of the bending region 1133. The hardness of the first sub-buffer layer 131 is larger than the hardness of the second sub-buffer layer 133. The flexible screen body can be bent easier due to the smaller hardness of the second sub-buffer layer 133.

In an embodiment, the buffer layer 130 covers a part of the bending region 1133. An area of the part of the bending region 1133 covered by the buffer layer 130 can be determined based upon a magnitude of the stress generated by the bending region 1133 of the flexible screen body.

In an embodiment, the first sub-buffer layer 131 is adjacent to the second sub-buffer layer 133. The first sub-buffer layer 131 can be in contact with the second sub-buffer layer 133. It should be understood that the specific position of the bending region 1133 that is covered by the second sub-buffer layer 133 can be decided according to the magnitude of the stress generated by the bending region 1133 of the flexible screen body. An additional buffer layer, such as a third sub-buffer layer, can be further provided to relieve the stress at another location of the bending region 1133.

In an embodiment, at least one of the first sub-buffer layer 131 and the second sub-buffer layer 133 is an organic adhesive layer. The organic adhesive layer has a soft aspect and a hard aspect. The organic adhesive layer is soft in order to relieve the stress of the region adjacent to the initial bending position of the flexible screen body, and the organic adhesive layer also has a hardness in order to support the region adjacent to the initial bending position of the flexible screen body, thereby preventing the stress concentration induced by the over-bending of the region adjacent to the initial bending position of the flexible screen body. In an embodiment, at least one of the first sub-buffer layer 131 and the second sub-buffer layer 133 is selected from at least one of an acrylic adhesive layer, a silicone adhesive layer, a polyurethane (PU) adhesive layer, an optically clear adhesive (OCA) layer, and so on.

The at least one of the first sub-buffer layer 131 and the second sub-buffer layer 133 can be a buffer layer made of other materials having the appropriate softness and hardness. In an embodiment, thicknesses of both the first sub-buffer layer 131 and the second sub-buffer layer 133 are gradually reduced along the direction from the first region 111 to the second region 113. The thickness of a section of the first sub-buffer layer 131 adjacent to the initial bending position is larger than the thickness of another section of the first sub-buffer layer 131 away from the initial bending position. The thickness of a section of the second sub-buffer layer 133 adjacent to the initial bending position is larger than the thickness of another section of the second sub-buffer layer 133 away from the initial bending position. In another embodiment, the thickness at everywhere of the first sub-buffer layer 131 can be the same, and the thickness at everywhere of the second sub-buffer layer 133 can be the same.

In an embodiment, the bending transitional region 1131 has a width B from 0.1 mm to 0.5 mm. That is, the width B of the bending transitional region 1131 is larger than or equal to 0.1 mm and smaller than or equal to 0.5 mm. As such, not only the stress at the initial bending position can be relieved by the first sub-buffer layer 131, but the space of the active region of the display panel will not be occupied too much, avoiding affecting the screen-to-body ratio of the display panel.

In an embodiment, referring to FIG. 1, the display panel 100 further includes a drive unit 150 and a flexible Printed Circuit 170 located on the extending region 1135. An interval exists between the drive unit 150 and the flexible printed circuit 170. In an embodiment, a Chip On Pi (COP) encapsulation technology is applied in the flexible screen body. It should be understood that the drive unit 150 and the flexible printed circuit 170 can also be disposed on other regions of the flexible screen body.

In an embodiment, referring to FIG. 1, the display panel 100 further includes a supporting layer 190 configured to support the flexible screen body. The first region 111 of the flexible screen body is located at one side of the supporting layer 190. The extending region 1135 of the flexible screen body is located at another side of the supporting layer 190 away from the first region 111. An end of the first sub-buffer layer 131 away from the second sub-buffer layer 133 is adjacent to and in contact with the supporting layer 190.

The supporting layer 190 can be made of hard but elastic material, so as to not only support the flexible screen body, but also reduce a vibration.

More specifically, the supporting layer 190 includes a first supporting film 191 located on a surface of the first region 111 adjacent to the extending region 1135, a second supporting film 193 located on a surface of the extending region 1135 adjacent to the first region 111, and a spacing block 195 located between the first supporting film 191 and the second supporting film 193.

In an embodiment, an end of the first sub-buffer layer 131 away from the second sub-buffer layer 133 is adjacent to and in contact with the first supporting film 191. An end surface of the first supporting film 191 adjacent to the bending region 1133 is coplanar with an interface where the first region 111 and the bending transitional region 1131 are joined. An end surface of the second supporting film 193 adjacent to the bending region 1133 is coplanar with a surface where a terminal bending position is located (i.e. an interface where the bending region 1133 and the extending region 1135 are joined).

In an embodiment, the first supporting film 191 and the second supporting film 193 are polyethylene terephthalate (PET) films. In an embodiment, thicknesses of the first supporting film 191 and the second supporting film 193 are in a range from 0 to 0.2 mm. That is, the thicknesses of the first supporting film 191 and the second supporting film 193 are larger than or equal to 0 mm and smaller than or equal to 0.2 mm.

The spacing block 195 can be made of a material such as a silica gel. The spacing block 195 can have an appropriate elasticity and an appropriate hardness. The spacing block 195 has the hardness, such that a deformation of the flexible screen body caused by squeezing can be avoided. The spacing block 195 has the elasticity, such that a damage of the flexible screen body caused by a local stress can be avoided.

In other embodiments, a certain distance between the first region 111 and the extending region 1135 can be achieved by increasing the thicknesses of the first supporting film 191 and the second supporting film 193, or by providing other supporting structures.

Figure 2:
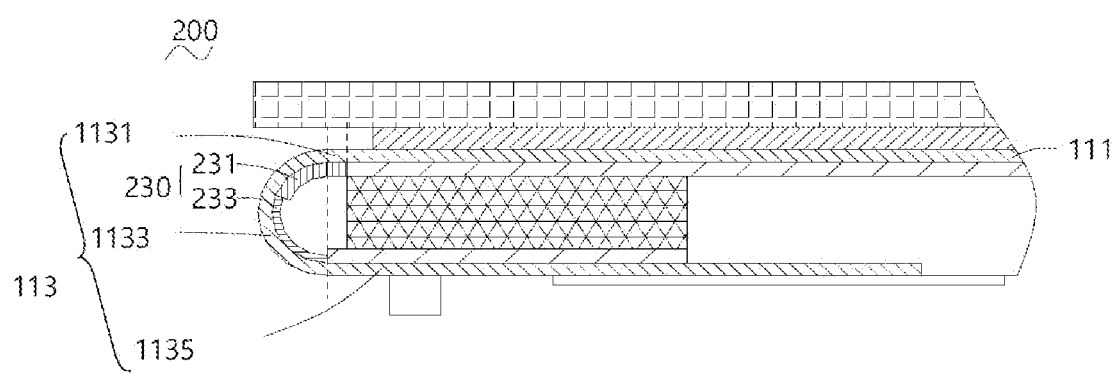
FIG. 2 is a schematic sectional view of a display panel provided by another embodiment of the present disclosure.

Referring to FIG. 2, a display panel 200 is provided in another embodiment of the present disclosure. The display panel 200 is distinguished from the display panel 100 in that the first sub-buffer layer 231 has the same thickness everywhere, and the second sub-buffer layer 233 has the same thickness everywhere.

In an embodiment, the first sub-buffer layer 231 and the second sub-buffer layer 233 are made of the same material, and the thickness of the first sub-buffer layer 231 is larger than the thickness of the second sub-buffer layer 233, so that the first sub-buffer layer 231 has a higher hardness than that of the second sub-buffer layer 233.

For example, in an embodiment, the first sub-buffer layer 231 and the second sub-buffer layer 233 are both OCA layers, the thickness of the first sub-buffer layer 231 is 0.1 mm, and the thickness of the second sub-buffer layer 233 is 0.075 mm.

In other embodiments, the first sub-buffer layer 231 and the second sub-buffer layer 233 can be made of different materials, as long as the first sub-buffer layer 231 has a higher hardness than that of the second sub-buffer layer 233.

In other embodiments, other manners can also be used to allow the first sub-buffer layer 231 to have a higher hardness than that of the second sub-buffer layer 233. For example, bending-resistant flexible particles are mixed in the first sub-buffer layer 231 and the second sub-buffer layer 233. A density of the bending-resistant flexible particles in the first sub-buffer layer 231 is larger than a density of the bending-resistant flexible particles in the second sub-buffer layer 233. Or the bending-resistant flexible particles can be mixed only in the first sub-buffer layer 231.

The bending-resistant flexible particles can be nylonparticles, polymethyl methacrylate (PMMA) particles, and so on.

In an embodiment, the bending region 1133 is entirely covered by the first sub-buffer layer 231 and the second sub-buffer layer 233. In another embodiment, the bending region 1133 can also be partially covered by the buffer layer 230. In an embodiment, only a part of the bending region 1133 tending to generate a relatively large stress can be covered by the buffer layer 230.

The present disclosure further provides a display device including the display panel provided by the present disclosure. The display device provided by the present disclosure can further include other components such as a case, which are not limited herein.

In the above-described display panel and the display device including the display panel, the joining position of the bending region joined to the bending transitional is the initial bending position. Different sections of the buffer layer can have different hardnesses. The section of the buffer layer adjacent to the initial bending position can have a higher hardness to support the region of the flexible screen body adjacent to the initial bending position, thereby preventing the stress concentration induced by over-bending the region adjacent to the initial bending position of the flexible screen body, to protect the region of the flexible screen body adjacent to the initial bending position.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present disclosure.

What described above are only several implementations of the present disclosure, and these embodiments are specific and detailed, but not intended to limit the scope of the present disclosure. It should be understood by the skilled in the art that various modifications and improvements can be made without departing from the conception of the present disclosure, and all fall within the protection scope of the present disclosure. Therefore, the patent protection scope of the present disclosure is defined by the appended claims.

The invention claimed is:

1. A display panel comprising: a flexible screen body having a first region and a second region connected with the first region, wherein: the second region comprises a bending transitional region, a bending region, and an extending region connected in sequence; the first region is connected to the bending region through the bending transitional region; and the bending transitional region is coplanar with the first region; neither the bending region nor the extending region is coplanar with the first region; the first region is a part of an active region of the flexible screen body; the bending region and the extending region are a non-active region of the flexible screen body; and the bending transitional region is another part of the active region; or the first region is an active region of the flexible screen body; the bending region and the extending region are a part of a non-active region of the flexible screen body; and the bending transitional region is another part of the non-active region of the flexible screen body; and a buffer layer disposed on surfaces of the bending transitional region and the bending region at a stress concentration side of the bending transitional region and the bending region, wherein at least two sections of the buffer layer are characterized by different hardnesses, wherein the buffer layer comprises a first sub-buffer layer and a second sub-buffer layer, the first sub-buffer layer covers the bending transitional region and a part of the bending region, the second sub-buffer layer covers another part of the bending region, and a hardness of the first sub-buffer layer is larger than a hardness of the second sub-buffer layer.

2. The display panel of claim 1, wherein at least one of the first sub-buffer layer and the second sub-buffer layer is an organic adhesive layer.

3. The display panel of claim 2, wherein at least one of the first sub-buffer layer and the second sub-buffer layer is an acrylic adhesive layer, a silicone adhesive layer, a polyurethane adhesive layer, or an optically clear adhesive layer.

4. The display panel of claim 1, wherein thicknesses of both the first sub-buffer layer and the second sub-buffer layer are gradually reduced along the direction from the first region to the second region.

5. The display panel of claim 1, wherein a thickness of the first sub-buffer layer is greater than a thickness of the second sub-buffer layer.

6. The display panel of claim 5, wherein the first sub-buffer layer and the second sub-buffer layer comprise a same material.

7. The display panel of claim 1, wherein the buffer layer comprises bending-resistant flexible particles, and a density of the bending-resistant flexible particles in the first sub-buffer layer is larger than a density of the bending-resistant flexible particles in the second sub-buffer layer.

8. The display panel of claim 7, wherein the bending-resistant flexible particles is selected from the group consisting of nylonparticles, polymethyl methacrylate particles, or a combination thereof.

9. The display panel of claim 1, wherein the bending transitional region has a width between about 0.1 mm and 0.5 mm.

10. The display panel of claim 1, further comprising:
a supporting layer configured to support the flexible screen body;
wherein the first region is located at one side of the supporting layer, the extending region is located at another side of the supporting layer away from the first region, and an end of the first sub-buffer layer away from the second sub-buffer layer is adjacent to and in contact with the supporting layer.

11. The display panel of claim 10, wherein the supporting layer comprises:
a first supporting film located on a surface of the first region adjacent to the extending region;
a second supporting film located on a surface of the extending region adjacent to the first region; and
a spacing block located between the first supporting film and the second supporting film.

12. The display panel of claim 11, wherein an end of the first sub-buffer layer away from the second sub-buffer layer is adjacent to and in contact with the first supporting film, and an end surface of the second supporting film adjacent to the bending region is coplanar with an interface where the bending region and the extending region are joined.

13. The display panel of claim 11, wherein a material of the first supporting film and a material of the second supporting film comprise polyethylene terephthalate, and a material of the spacing block comprises silica gel.

14. The display panel of claim 11, wherein thicknesses of the first supporting film and the second supporting film about 0.2 mm or less.

15. The display panel of claim 1, wherein a metal wiring is disposed in the bending region, and an aperture is defined in the metal wiring.

16. The display panel of claim 1, wherein the bending region has an arched shape.

17. The display panel of claim 1, wherein a bending angle of the bending region is 180 degrees.

18. The display panel of claim 1, further comprising a drive unit and a flexible printed circuit disposed on the extending region.

19. A display device, comprising a display panel comprising: a flexible screen body, having a first region and a second region connected with the first region, wherein: the second region has a bending transitional region, a bending region, and an extending region connected in sequence; the first region is connected to the bending region through the bending transitional region, and the bending transitional region is coplanar with the first region; neither the bending region nor the extending region is coplanar with the first region; the first region is a part of an active region of the flexible screen body; the bending region and the extending region are a non-active region of the flexible screen body; and the bending transitional region is another part of the active region; or the first region is an active region of the flexible screen body; the bending region and the extending region are a part of a non-active region of the flexible screen body; and the bending transitional region is another part of the non-active region of the flexible screen body; and a buffer layer disposed on surfaces of the bending transitional region and the bending region at a stress concentration side of the bending transitional region and the bending region, wherein at least two sections of the buffer layer have different hardnesses, wherein the buffer layer comprises a first sub-buffer layer and a second sub-buffer layer, the first sub-buffer layer covers the bending transitional region and a part of the bending region, the second sub-buffer layer covers another part of the bending region, and a hardness of the first sub-buffer layer is larger than a hardness of the second sub-buffer layer.

* * * * *